(12) United States Patent
Kojima

(10) Patent No.: US 7,157,797 B2
(45) Date of Patent: Jan. 2, 2007

(54) SEMICONDUCTOR DEVICE WITH SUPPRESSED COPPER MIGRATION

(75) Inventor: Hideyuki Kojima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/145,227

(22) Filed: Jun. 6, 2005

(65) Prior Publication Data

US 2006/0091549 A1    May 4, 2006

(30) Foreign Application Priority Data

Oct. 29, 2004    (JP)    ............................. 2004-316791

(51) Int. Cl.
  *H01L 23/48*    (2006.01)
  *H01L 23/52*    (2006.01)
  *H01L 29/40*    (2006.01)

(52) U.S. Cl. .................. 257/758; 257/759; 257/760; 257/762; 257/774; 257/784

(58) Field of Classification Search ........ 257/758–760, 257/762, 774, 784
See application file for complete search history.

(56) References Cited

U.S. PATENT DOCUMENTS

| 6,228,767 B1* | 5/2001 | Yakura ....................... 438/687 |
| 6,518,167 B1* | 2/2003 | You et al. ................... 438/622 |
| 6,713,383 B1* | 3/2004 | Shioya et al. ............... 438/624 |
| 6,774,020 B1* | 8/2004 | Fukada et al. .............. 438/584 |
| 6,818,546 B1* | 11/2004 | Saito et al. ................. 438/618 |
| 6,858,936 B1* | 2/2005 | Minamihaba et al. ....... 257/758 |
| 2002/0141232 A1* | 10/2002 | Saito et al. ................. 365/158 |
| 2003/0087514 A1* | 5/2003 | Tang et al. .................. 438/630 |
| 2003/0227086 A1* | 12/2003 | Otsuka et al. .............. 257/758 |
| 2004/0009654 A1* | 1/2004 | Abe ........................... 438/622 |
| 2005/0012129 A1* | 1/2005 | Saito .......................... 257/296 |
| 2005/0048708 A1* | 3/2005 | Yamada et al. ............. 438/197 |
| 2005/0051870 A1* | 3/2005 | Yamazaki et al. .......... 257/531 |
| 2005/0161825 A1* | 7/2005 | Watanabe ................... 257/758 |

FOREIGN PATENT DOCUMENTS

| JP | 11-307639 | 11/1999 |
| JP | 2001-244267 | 9/2001 |
| JP | 2002-140042 | 5/2002 |
| JP | 2003-31664 | 1/2003 |
| JP | 2003-115540 | 4/2003 |

* cited by examiner

*Primary Examiner*—Ida M. Soward
(74) *Attorney, Agent, or Firm*—Westerman, Hattori, Daniels & Adrian, LLP.

(57) ABSTRACT

A semiconductor device having: a semiconductor substrate; a plurality of circuit regions formed on the semiconductor substrate, the circuit regions including circuits driven at multiple supply voltages; interlayer insulating film or films formed above the semiconductor substrate; copper wirings buried in the interlayer insulating film or films, a minimum wiring spacing between adjacent wirings in a same layer so that an electric field between adjacent wirings due to an applied voltage difference is set to 0.4 MV/cm or lower; and a copper diffusion preventive film formed on the interlayer insulating film, covering an upper surface of the copper wirings. A semiconductor device is provided which has copper wirings capable of realizing a high reliability in a long term, basing upon newly found knowledge of time dependent failure rate of wiring.

5 Claims, 16 Drawing Sheets

FIG. 3A1
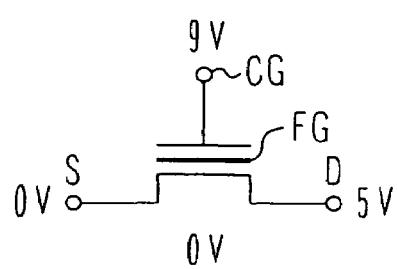
FIG. 3A2
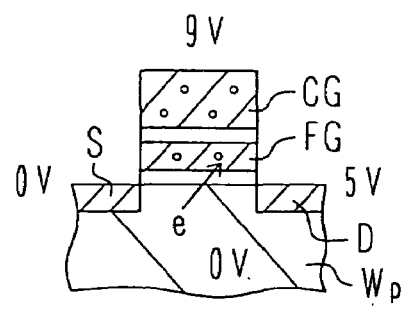
FIG. 3B1
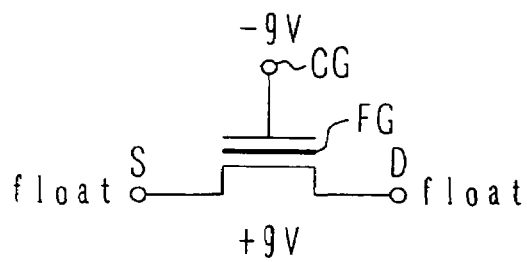
FIG. 3B2
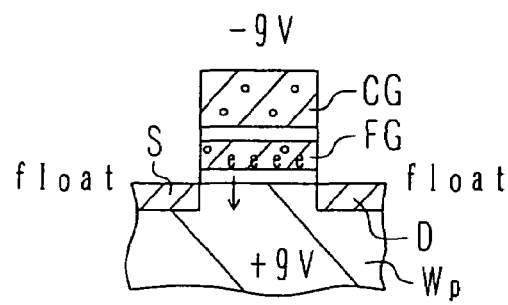

FIG. 3C

TABLE1: EXAMPLES OF OPERATION VOLTAGE OF LOGIC DEVICE MIXEDLY MOUNTING FLASH MEMORY

|  |  | SOURCE VOLTAGE | GATE (WORD LINE) VOLTAGE | DRAIN (BIT LINE) VOLTAGE | SUBSTRATE (WELL) VOLTAGE |
|---|---|---|---|---|---|
| LOGIC CIRCUIT |  | 0V | 1.2V | 1.2V | 0V |
| FLASH CELL | WRITE | 0V | 9V | 5V | 0V |
|  | ERASE | FLOATING | -9V | FLOATING | 9V |
|  | READ | 0V | 5V | 1V | 0V |

FIG.4A

TABLE2: CRITERIA OF MINIMUM WIRING SPACING AT MAIN OPERATION VOLTAGES (TABLE1)

| VOLTAGE BETWEEN ADJACENT WIRINGS | SHORTEST WIRING PITCH ($\mu m$) | ELECTRIC FIELD BETWEEN WIRINGS (MV/cm) |
|---|---|---|
| $0V \leq x \leq 1.2V$ | 0.030 | 0.4 |
| $1.2V < x \leq 5.0V$ | 0.125 | 0.4 |
| $5.0V < x \leq 10V$ | 0.250 | 0.4 |
| $10V < x \leq 15V$ | 0.375 | 0.4 |

FIG.4B

TABLE3: COMPARISON BETWEEN MINIMUM FLASH CELL SIZES WHEN MINIMUM WIRING SPACING IS USED

| | MINIMUMT WORD LINE SPACING ($\mu m$) | MINIMUM BIT LINE SPACING ($\mu m$) | MINIMUMT SELF SIZE ($\mu m^2$) | | (a)/(b) |
|---|---|---|---|---|---|
| CONVENTIONAL | 0.25 | 0.25 | (a) | 0.0625 | 200% |
| CRITERIA OF TABLE2 | 0.25 | 0.125 | (b) | 0.03125 | |

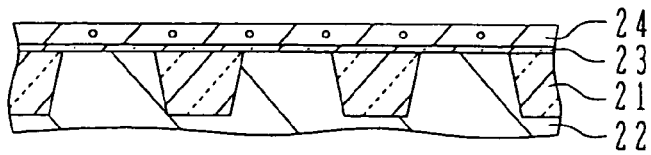
FIG. 8A
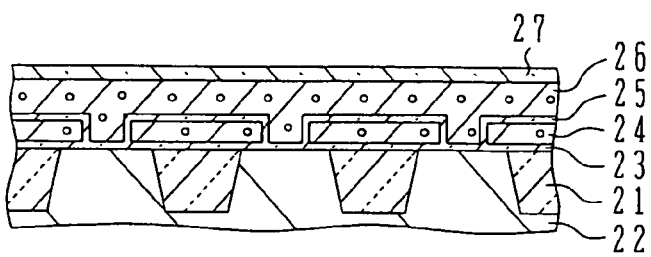
FIG. 8Bx
FIG. 8By
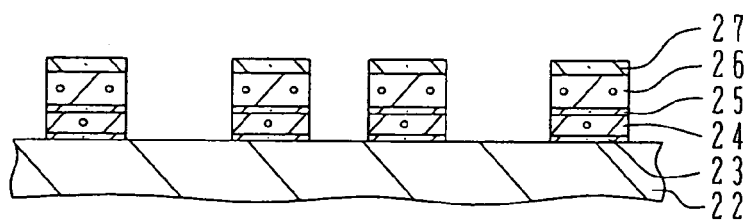
FIG. 8Cy1
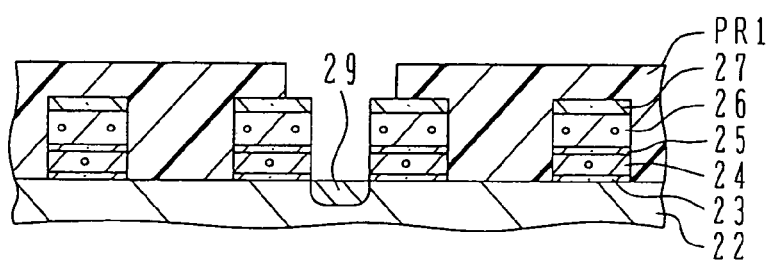
FIG. 8Cy2
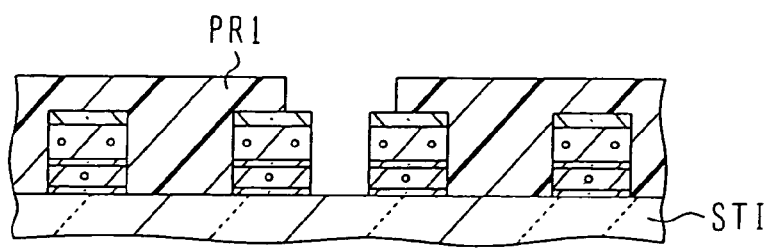

FIG. 8Dy1
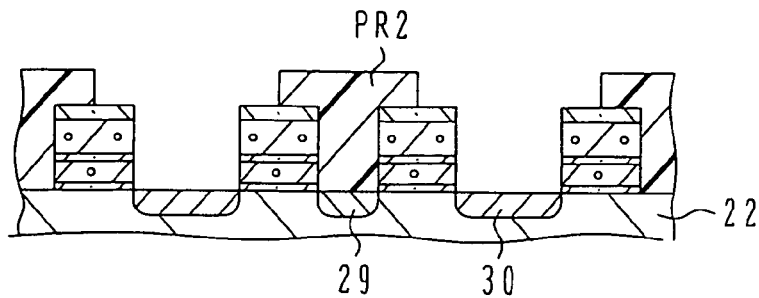
FIG. 8Dy2
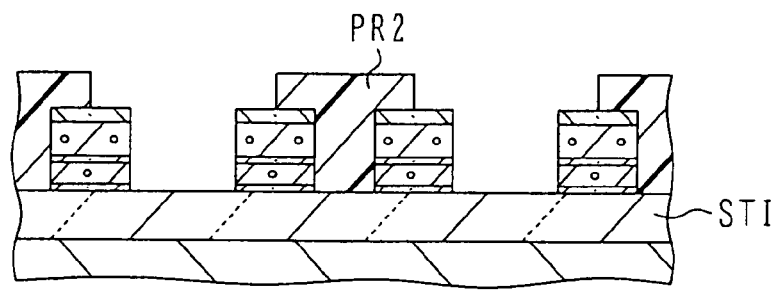
FIG. 8Ey1
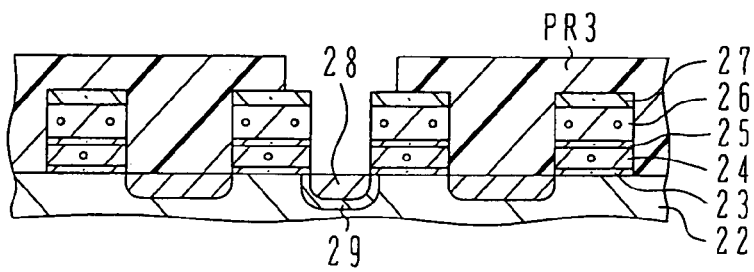
FIG. 8Ey2
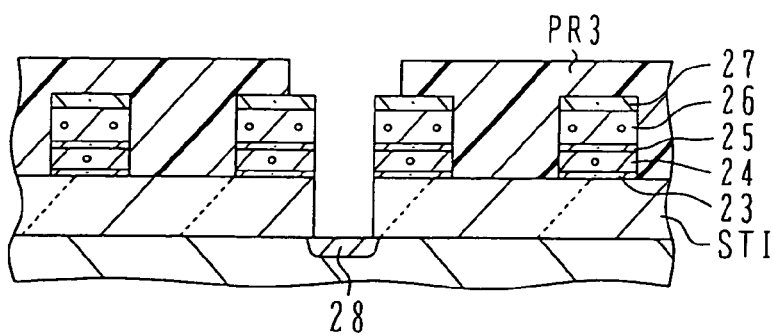

FIG. 8Fx
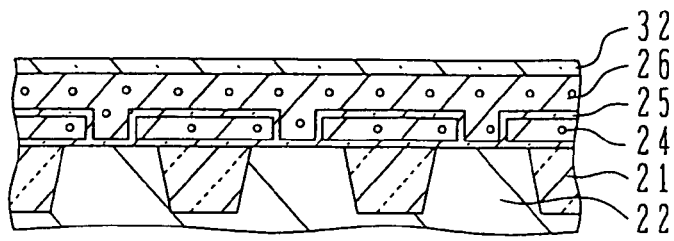
FIG. 8Fy1
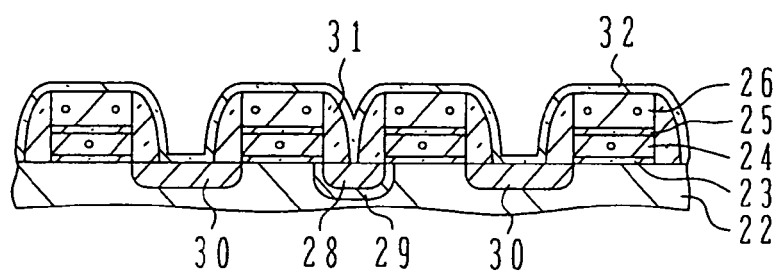
FIG. 8Fy2
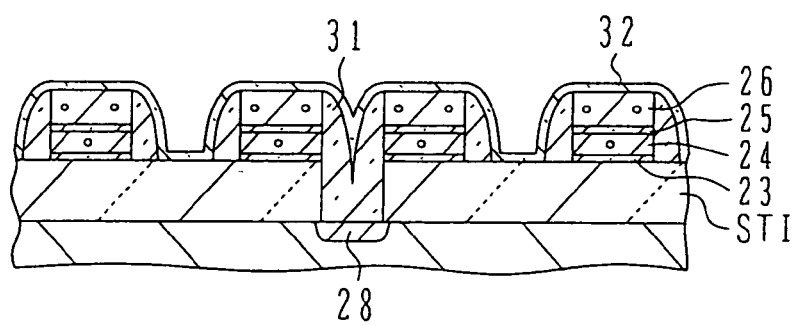
FIG. 8Gx
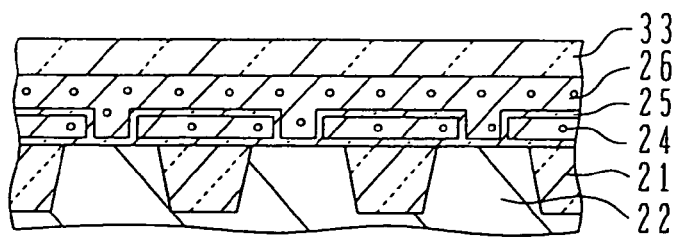

FIG. 8Gy1
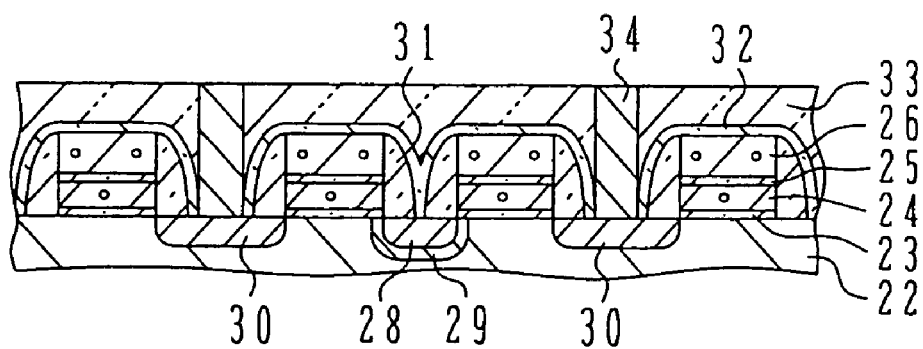
FIG. 8Gy2
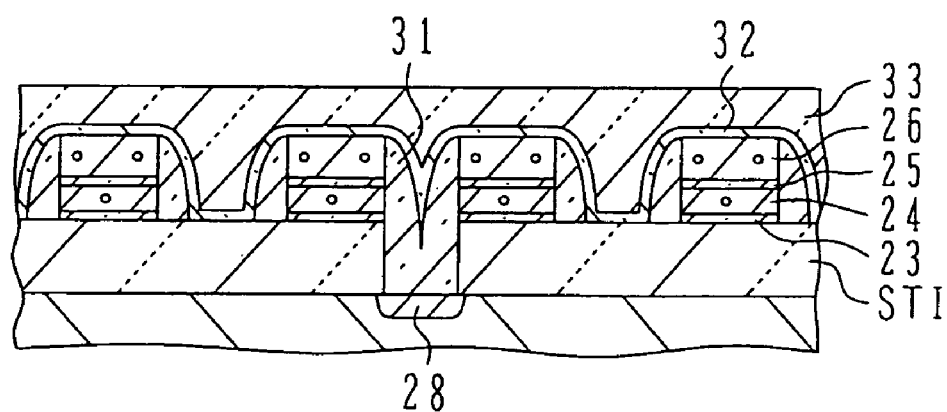

SEMICONDUCTOR DEVICE WITH SUPPRESSED COPPER MIGRATION

CROSS REFERENCE TO RELATED APPLICATION

This application is based on and claims priority of Japanese Patent Application No. 2004-316791 filed on Oct. 29, 2004, the entire contents of which are incorporated herein by reference.

BACKGROUND OF THE INVENTION

A) Field of the Invention

The present invention relates to a semiconductor device, and more particularly to a semiconductor device having copper wirings and including a circuit area driven at a plurality of voltages.

B) Description of the Related Art

Non-volatile memories or flash memories having floating gates are mixedly mounted on various semiconductor devices. Data write to a flash memory is performed by channel hot electron injection (CHI). Data erase of a flash memory is performed by Fowler-Nordheim tunneling. These operations require high voltage.

Although it has been tried to lower an operation voltage of a flash memory, an approach to low voltage does not progress actually because of a difficulty in thinning a tunnel oxide film in terms of reliability.

An aluminum wiring is formed by etching an aluminum layer having upper and lower barrier metal layers, and an interlayer insulating film is formed by depositing a silicon oxide film on the aluminum layer by plasma CVD. In case of the inter metal dielectric structure having aluminum wirings, there is no concern about the time dependent deterioration of breakdown between wirings, and the wiring rules defined for a low voltage area can be applied also to a high voltage layer, allowing dense patterns.

Recent needs for high speed and low power consumption of a logic circuit have expedited lowering a power supply voltage, adopting copper wirings as multilayer wirings, adopting low dielectric constant insulating films as interlayer insulating films. Since high precision etching of a copper wiring is difficult, a copper wiring is formed by a damascene process which forms wiring trenches and/or via holes in an interlayer insulating film, buries a copper wiring layer and patterns the copper wring layer by removing an unnecessary portion thereof on the interlayer insulating film. In order to prevent copper from being diffused, a barrier metal layer is formed as an underlay of the copper layer, and after the copper wiring layer is patterned, a copper diffusion preventive insulating film such as a silicon nitride film is formed on the patterned copper wiring.

A highly integrated semiconductor device has multilayer wirings. If the semiconductor device has a plurality of circuit areas, these areas use different power supply voltages in some cases. If the wiring design rule for a circuit area using a highest power supply voltage is adopted to all integrated circuits to ensure safety, the semiconductor chip area increases. Japanese Patent Laid-open Publication No. 2003-115540 proposes to change the design rule for each of circuit areas using different power supply voltages in accordance with its voltage.

Japanese Patent Laid-open Publication No. HEI-11-307639 proposes that in a power source circuit of a semiconductor integrated circuit having a plurality of power supply lines having different pitches or a plurality of power supply lines having different potentials, a relay power source line is connected to each power source line at each potential to supply power via the relay power source line.

It has been indicated that a wiring pitch is required to be controlled in accordance with the potential applied to each wiring. Japanese Patent Laid-open Publication No. 2003-31664 proposes a design method which designs a wiring layout in accordance with a wiring pitch corresponding to a potential difference between nets of a net list obtained from wiring connection information.

SUMMARY OF THE INVENTION

An object of this invention is to provide a semiconductor device having copper wirings capable of realizing a high reliability in a long term, basing upon newly found knowledge of a time dependent failure rate of wiring.

According to one aspect of the present invention, there is provided a semiconductor device comprising: a semiconductor substrate; a plurality of circuit regions formed on the semiconductor substrate, the circuit regions including circuits driven at a multiple-voltage; an interlayer insulating film formed above the semiconductor substrate; copper wirings buried in the interlayer insulating film, the copper wirings being formed at a minimum wiring spacing between adjacent wirings so that an electric field between adjacent wirings due to an applied voltage difference is set to 0.4 MV/cm or lower; and a copper diffusion preventive film formed on the interlayer insulating film, covering an upper surface of the copper wirings.

A newly found issue of a time dependent wiring defect problem can be mitigated without increasing an area of a circuit driven at a multiple-voltage and having copper wirings buried in an interlayer insulating film with a copper diffusion preventive film.

BRIEF DESCRIPTION OF THE DRAWINGS

FIGS. 3A1, 3A2, 3B1, 3B2 and 3C are equivalent circuit diagrams illustrating the operation of a flash memory cell, cross sectional views of the flash memory cell, and a table showing an example of operation voltages of a logic circuit mixedly mounting flash memory cells.

FIGS. 4A and 4B are a table showing minimum wiring spacings at main operation voltages and a table showing minimum flash memory cell sizes when the minimum wiring spacing is used.

FIG. 8A is a cross sectional view illustrating a manufacture process for the SAS type flash memory shown in FIGS. 7A to 7D, FIG. 8Bx is a cross sectional view illustrating a manufacture process for the SAS type flash memory shown in FIGS. 7A to 7D, FIG. 8By is a cross sectional view illustrating a manufacture process for the SAS type flash memory shown in FIGS. 7A to 7D, FIG. 8Cy1 is a cross sectional view illustrating a manufacture process for the SAS type flash memory shown in FIGS. 7A to 7D, FIG. 8Cy2 is a cross sectional view illustrating a manufacture process for the SAS type flash memory shown in FIGS. 7A to 7D, FIG. 8Gx is a cross sectional view illustrating a manufacture process for the SAS type flash memory shown in FIGS. 7A to 7D, FIG. 8Dy2 is a cross sectional view illustrating a manufacture process for the SAS type flash memory shown in FIGS. 7A to 7D, FIG. 8Ey1 is a cross sectional view illustrating a manufacture process for the SAS type flash memory shown in FIGS. 7A to 7D, FIG. 8Ey2 is a cross sectional view illustrating a manufacture process for the SAS type flash memory shown in FIGS. 7A to 7D, FIG. 8Fx is a cross sectional view illustrating a manufacture process for the SAS type flash memory shown in FIGS. 7A to 7D, FIG. 8Fy1 is a cross sectional view illustrating a manufacture process for the SAS type flash memory shown in FIGS. 7A to 7D, FIG. 8Fy2 is a cross sectional view illustrating a manufacture process for the SAS type flash memory shown in FIGS. 7A to 7D, FIG. 8Gx is a cross sectional view illustrating a manufacture process for the SAS type flash memory shown in FIGS. 7A to 7D, FIG. 8Gy1 is a cross sectional view illustrating a manufacture process for the SAS type flash memory shown in FIGS. 7A to 7D, and FIG. 8Gy2 is a cross sectional view illustrating a manufacture process for the SAS type flash memory shown in FIGS. 7A to 7D.

DESCRIPTION OF THE PREFERRED EMBODIMENTS

A copper wiring is formed by the following damascene process. A wiring recess of a via hole and/or wiring trench is formed in an interlayer insulating film. A barrier metal layer of Ta or the like is formed on the surface of the wiring recess by sputtering, and a copper layer is formed on the barrier metal layer by plating or the like. An unnecessary metal layer on the interlayer insulating film is removed by chemical mechanical polishing (CMP) or the like to pattern a copper wiring. A copper diffusion preventive film such as a silicon nitride film is formed on the interlayer insulating film by CVD or the like, the copper diffusion preventive film covering the copper wiring buried in the wiring recess. A copper wiring of one layer is formed in this manner. Another interlayer insulating film is formed to form an upper level wiring.

It has been found that copper migration occurs more preferentially at the interface between the interlayer insulating film buried with the copper wiring and the upper copper diffusion preventive film, than in the interlayer insulating film of the copper wiring structure formed in the above-described method, resulting in time dependent degradation of breakdown voltage. Under what conditions time dependent failure occurs has been studied experimentally.

Figure 1A:
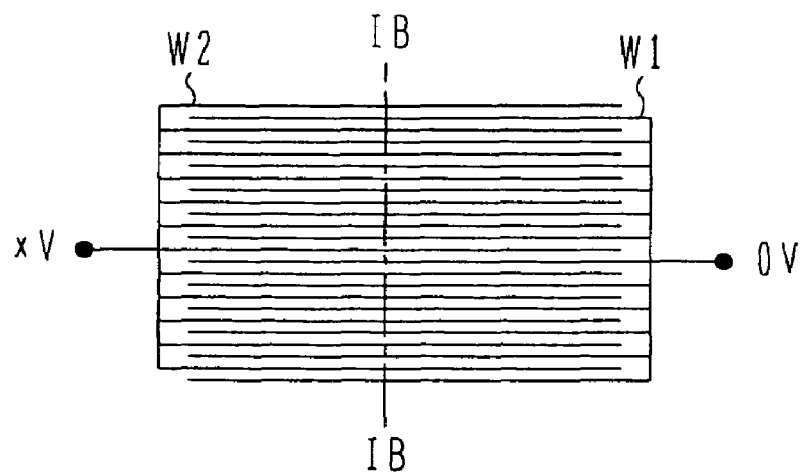
FIGS. 1A and 1B are a plan view and a cross sectional view showing the structure of a sample.
Figure 1B:
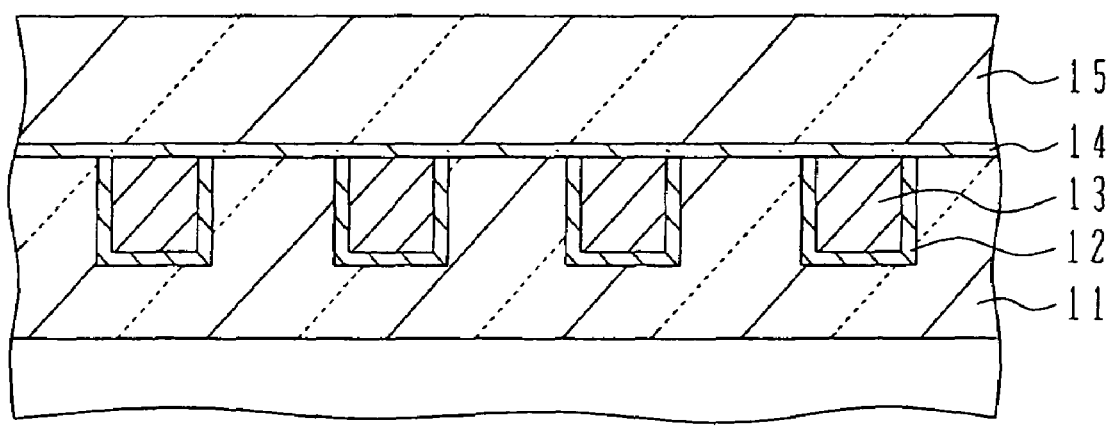

FIGS. 1A and 1B are a plan view and a cross sectional view showing the structure of a sample formed. As shown in FIG. 1A, wirings W1 and W2 of an inter-digital type face each other. Both wirings are lead outward. One wirings W1 are grounded and the other wirings W2 are applied with a predetermined voltage, e.g., 7 V. By changing the voltage to be applied and the opposing wiring pitch, an electric field intensity between wirings is changed.

FIG. 1B shows a cross sectional structure of wirings. A wiring trench is formed in an interlayer insulating film 11, a barrier metal layer 12 covers the trench surface, and a copper wiring 13 is buried in the remaining space of the trench. A silicon oxide film 14 is formed covering the surfaces of the copper wiring structure 12, 13 and the interlayer insulating film 11. Another interlayer insulating film 15 is formed on the silicon nitride film 14. Contact holes are formed through the upper interlayer insulating film 15 and copper diffusion preventive film 14 to lead the wirings to the surface of the interlayer insulating film 15.

Figure 2A:
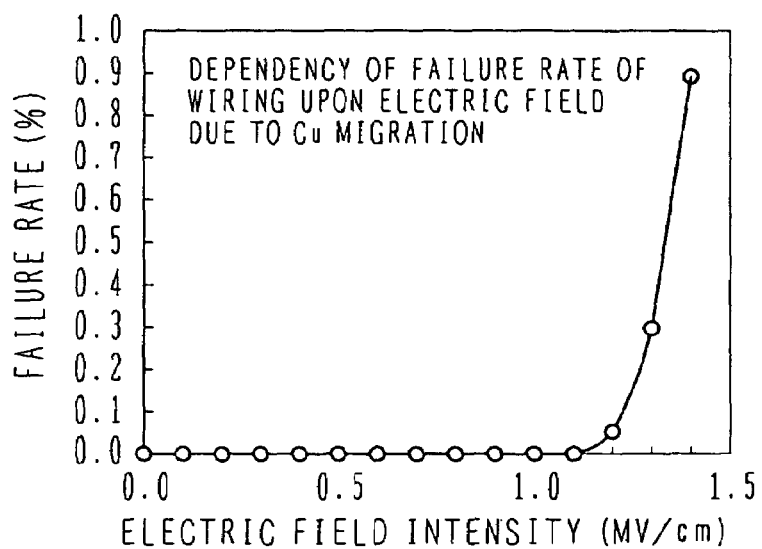
FIGS. 2A, 2B and 2C are graphs showing the dependency of a failure rate of wiring upon an electric field at operation temperatures of 25° C. and 115° C. in a time dependent change of 100 Kh, and the dependency of a maximum allowable electric field upon a rated temperature.

FIG. 2A is a graph showing the dependency of a failure rate of wiring upon an electric field due to a time dependent change in 100 Kh (ten years=87.6 Kh), as measured at 25° C. The failure rate is approximately 0 (smaller than 0.01%) at an electric field intensity lower than 1.0 MV/cm, and increases at 1.1 MV/cm or higher.

Figure 2B:
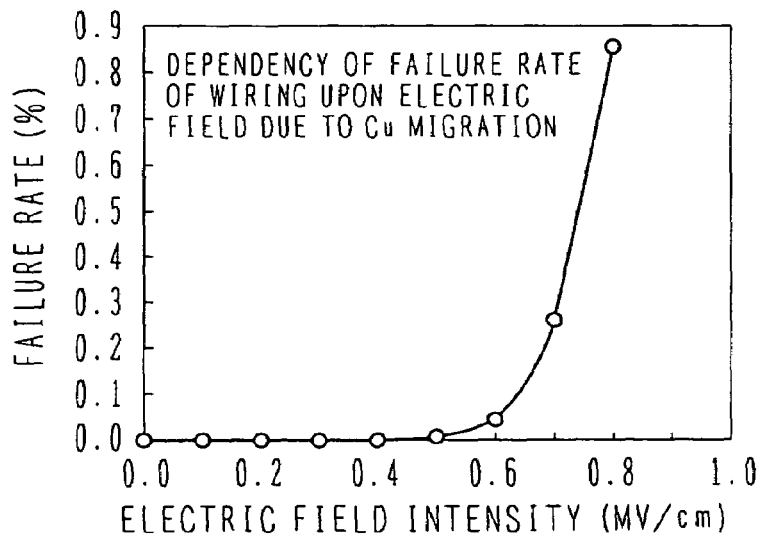

FIG. 2B is a graph showing the dependency of a failure rate of wiring upon an electric field due to a time dependent change in 100 Kh, as measured at 115° C. The failure rate is smaller than 0.01% at an electric field intensity lower than 0.4 MV/cm, and increases at 0.5 MV/cm or higher.

Figure 2C:
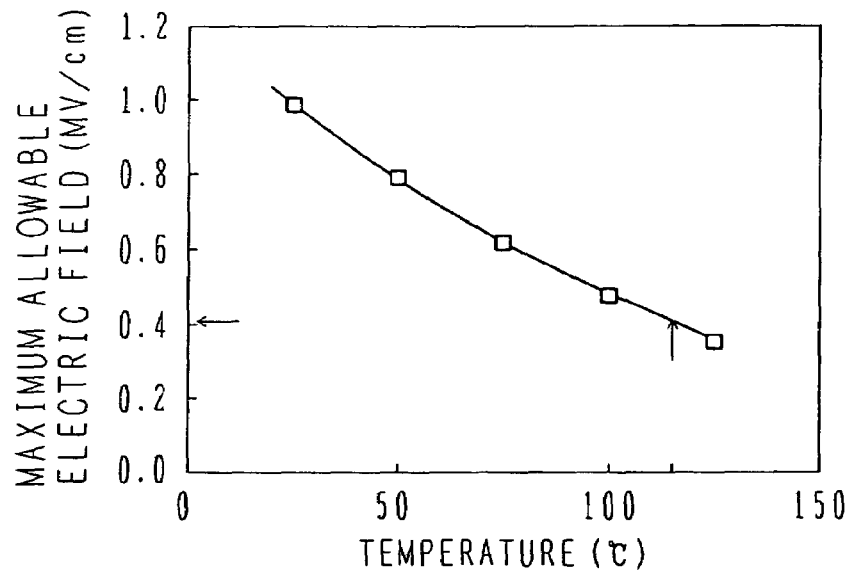

FIG. 2C is a graph showing the relation between a maximum allowable electric field and a rated temperature obtained by making similar experiments described above at different temperatures. Here, a maximum electric field having failure rate below 0.01% is defined as a maximum allowable electric field. The maximum allowable electric field at the temperature of 115° C. is higher than 0.4 MV/cm which corresponds to the experiment results shown in FIG. 2B. In order to realize no failure in ten years at the operation temperature of 115° C., it is desired to set the electric field intensity between wirings is set to 0.4 MV/cm (40 V/µm) or lower. As the temperature is raised, the maximum allowable electric field intensity lowers.

A copper diffusion preventive film (also as an etch stopper) may be made of SiC in addition to SiN. Even if SiC is used for the copper diffusion preventive film, similar criterion as described above is expected to be usable.

A drive voltage of a logic circuit is lowering to 1.2 V in the 130 nm generation. In a logic circuit mixedly mounting a flash memory, a plurality of high voltages are used for the flash memory and its drive circuit. A plurality of these voltages are called a multiple-voltage. In a flash memory, a tunneling oxide film having a thickness of 9 to 10 nm is still used because of reliability, and high voltages are necessary in write and erase operations among others.

FIGS. 3A1 and 3A2 are an equivalent circuit diagram and a cross sectional view showing voltages used in a write operation. As shown in FIG. 3A2, a p-type well Wp is formed in a silicon substrate. On the substrate surface, a gate electrode structure is formed which is a lamination of a gate oxide film, a floating gate FG, an insulating film and a control gate CG. On both sides of the gate electrode structure, n-type impurities are doped to form a source S and a drain D. This structure is indicated by symbols shown in FIG. 3A1.

The source S and p-type well Wp are grounded (0 V), 9 V is applied to the control gate CG and 5 V is applied to the drain D. Electrons pulled out of the source S drift toward the drain D applied with 5 V and change to hot electrons. These hot electrons undergo channel hot electron injection (CHI) into the floating gate FG whose potential is raised by the control gate CG applied with 9 V.

Since the write operation is performed selectively, 9V is applied to the selected word line (gate), 0 V is applied to the non-selected word line, 5 V is applied to the selected bit line (drain), and 0 V is applied to the non-selected bit line. Therefore, 9 V at a maximum is applied between adjacent word lines, and 5 V at a maximum is applied between adjacent bit lines.

FIGS. 3B1 and 3B2 are an equivalent circuit diagram and a cross sectional view showing voltages used in an erase operation. It is assumed that electrons are stored in the floating gate FG. The source S and drain D are made in a floating state, −9 V is applied to the control gate CG, and +9 V is applied to the p-type well Wp. A floating gate FG potential is raised due to a coupling in capacitance between a floating gate FG and control gate CG. Because of a high voltage between the control gate CG and p-type well Wp, electrons stored in the floating gate FG pass through the gate insulating film by FN tunneling and drained to the p-type well Wp. Since the erase operation can be performed collectively, it is not necessary to form a potential difference between adjacent word lines. If the erase operation is performed separately for each word line, a voltage difference of 9 V at a maximum is formed between adjacent word lines.

FIG. 3C shows Table 1 summarizing operation voltages of a logic circuit operating at 1.2 V and a flash memory cell. In the logic circuit, 1.2 V is applied to the drain and gate of a transistor to be turned on. 0 V is applied to the gate of a transistor to be turned off. The potential at a well is, for example, 0 V. Only 1.2 V is applied at the maximum between adjacent wirings. The voltages applied to a flash memory in the write and erase operations are those described above. In the read operation of the flash memory, 5 V is applied to the selected word line, and 1 V is applied to the selected bit line. Between adjacent word lines, for example, 9 V is applied at the maximum, and between adjacent bit lines, 5 V is applied at the maximum. 9 V is applied between the source S and gate G at the maximum.

FIG. 4A shows Table 2 which indicates the minimum wiring spacing (μm) at each main operation voltage which pitch satisfies the above-described maximum allowable electric field of 0.4 MV/cm (40 V/μm). The minimum wiring spacings are 0.03 μm, 0.125 μm, 0.250 μm, and 0.375 μm for the voltages×between adjacent wirings, as classified into 0 V≦x≦1.2 V, 1.2 V<x≦5.0 V, 5.0 V<x≦10 V, and 10 V<x≦15 V, respectively. With this classification, designs will not be made excessively complicated and reduction in a chip area can be made easily while the defect factor is suppressed.

FIG. 4B shows Table 3 which indicates a minimum flash memory cell size when the minimum wiring spacing is used, as compared to prior art. Both the word line pitch and bit line pitch are 0.25 μm according to the prior art. According to the criteria shown in Table 2, although the word line pitch is 0.25 μm same as the prior art, the bit line pitch is halved to 0.125 μm from prior art 0.25 μm. The minimum cell size by this art becomes a half of the minimum cell size by a prior art.

In the following, description will be made on a semiconductor device using the above-described criteria according to an embodiment. It is known that a flash memory has two types: a non-self aligned source (SAS) type forming electrodes on the source and drain; and an SAS type connecting sources in a semiconductor substrate. First, description will be made on a non-SAS type flash memory.

Figure 5A:
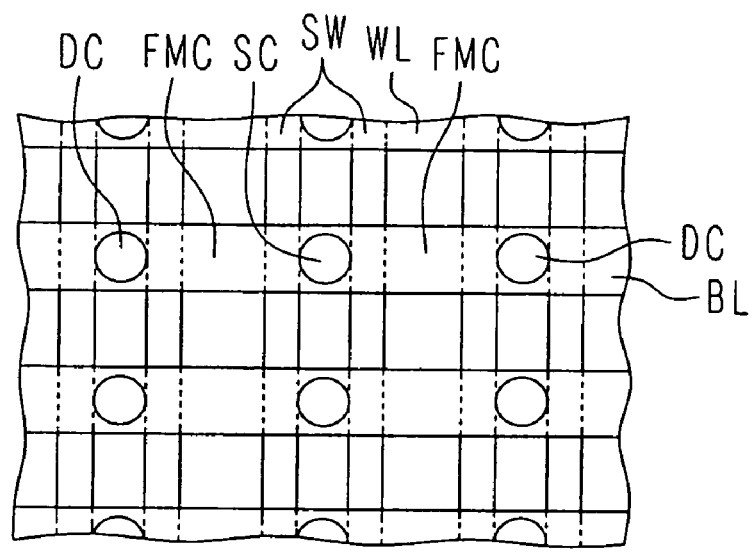
FIGS. 5A and 5B are a plan view and a cross sectional view showing the structure of a non-SAS type flash memory.
Figure 5B:
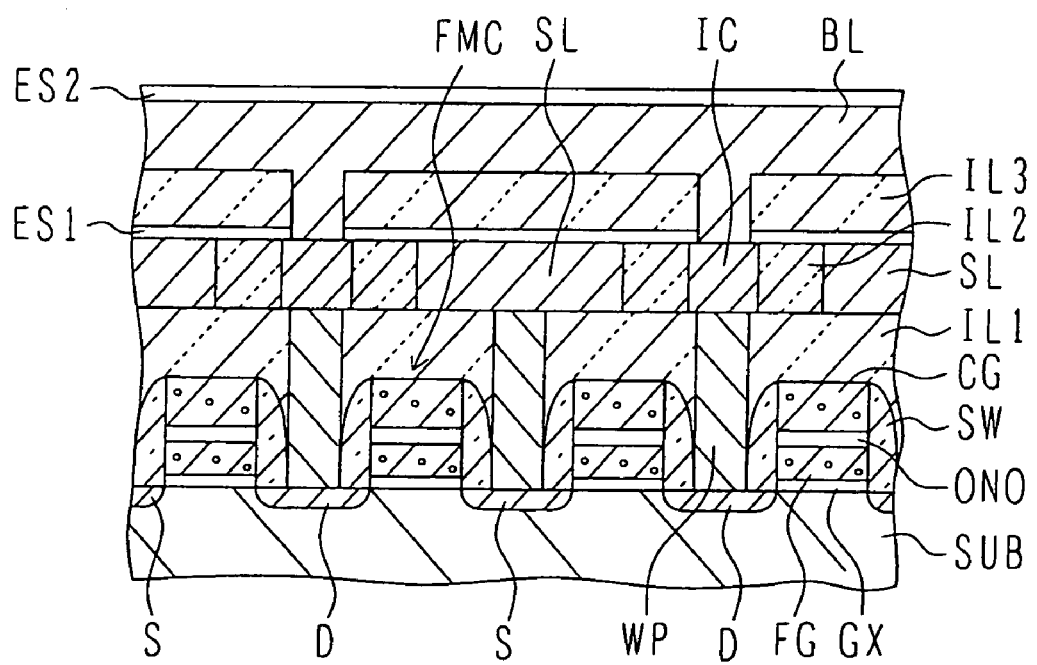

FIGS. 5A and 5B are a plan view and a cross sectional view showing the structure of a non-SAS type flash memory. As shown in FIG. 5A, flash memory cells FMC are disposed in a matrix shape, separated by an element isolation region in the column direction and connected in series in the row direction. A source contact SC is connected to a source and a drain contact DC is connected to a drain. A word line WL serving also as control gates of flash memory cells FMC extends in the column direction, and a bit line is connected to drain contacts DC and extends in the row direction. Source lines SL connected to source contacts SC extend in parallel to the word lines.

As shown in FIG. 5B, a gate electrode is made of a lamination layer of a gate oxide film GX, a floating gate FG, an ONO lamination insulating film (oxide film-nitride film-oxide film) and a control gate CG. A source S and a drain D are formed in the semiconductor substrate (well) on both sides of the gate electrode. Each pair of source S and drain D on both sides of the gate electrode is alternately disposed. Namely, the source S and drain D of adjacent flash memory cells are used in unison.

A lower interlayer insulating film IL1 is formed covering the gate electrodes, and contact holes reaching the sources S and drains D are formed through the lower interlayer insulating film IL1. Tungsten plugs WP are buried in the contact holes. A second interlayer insulating film IL2 of silicon oxide or the like is formed on the lower interlayer insulating film IL1, and trenches are formed therethrough. A first copper wiring is buried in each trench. The first copper wirings includes the source lines SL and drain interconnect portions IC. A copper diffusion preventive film ES1 serving also as an etch stopper of silicon nitride, silicon carbide or the like is formed on the second interlayer insulating film IL2, covering the first copper wirings. A third interlayer insulating film IL3 is formed on the copper diffusion preventive film. Trenches and via holes reaching the interconnect portions are formed and second copper wirings constituting the bit lines BL are buried in the trenches and via holes. Another copper diffusion preventive film ES2 serving also as an etch stopper of silicon nitride, silicon carbide or the like is formed on the third interlayer insulating film IL3, covering the second copper wirings.

In the first copper wiring, the source line SL and bit line connection portion IC are disposed near to each other and a maximum voltage difference therebetween is 5 V. Therefore, the corresponding minimum wiring spacing is 0.125 μm. The second copper wirings (bit lines BL) are disposed near to each other as shown in FIG. 5A and a maximum voltage difference therebetween is 5 V. Therefore, the corresponding minimum wiring spacing is 0.125 µm. Also in the drive circuit, the minimum wiring spacing is determined by using as the reference the voltage difference between wirings to be connected to the wirings of the flash memory cells.

Figure 6A:
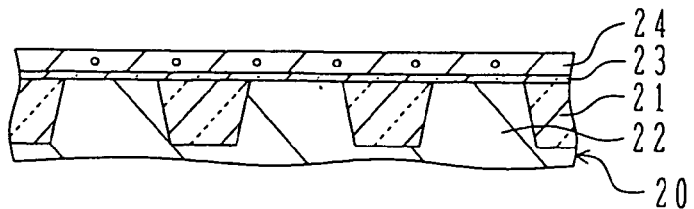
FIG. 6Ax is a cross sectional view illustrating a manufacture process for the non-SAS type flash memory shown in FIGS. 5A and 5B, FIG. 6Ay is a cross sectional view illustrating a manufacture process for the non-SAS type flash memory shown in FIGS. 5A and 5B, FIG. 6Bx is a cross sectional view illustrating a manufacture process for a non-SAS type flash memory shown in FIGS. 5A and 5B, FIG. 6By is a cross sectional view illustrating a manufacture process for the non-SAS type flash memory shown in FIGS. 5A and 5B, FIG. 6Cx is a cross sectional view illustrating a manufacture process for a non-SAS type flash memory shown in FIGS. 5A and 5B, FIG. 6Cy is a cross sectional view illustrating a manufacture process for the non-SAS type flash memory shown in FIGS. 5A and 5B, FIG. 6Dx is a cross sectional view illustrating a manufacture process for a non-SAS type flash memory shown in FIGS. 5A and 5B, FIG. 6Dy is a cross sectional view illustrating a manufacture process for the non-SAS type flash memory shown in FIGS. 5A and 5B, FIG. 6Ex is a cross sectional view illustrating a manufacture process for a non-SAS type flash memory shown in FIGS. 5A and 5B, FIG. 6Ey is a cross sectional view illustrating a manufacture process for the non-SAS type flash memory shown in FIGS. 5A and 5B, FIG. 6Fx is a cross sectional view illustrating a manufacture process for a non-SAS type flash memory shown in FIGS. 5A and 5B, and FIG. 6Fy is a cross sectional view illustrating a manufacture process for the non-SAS type flash memory shown in FIGS. 5A and 5B.
Figure 6A:
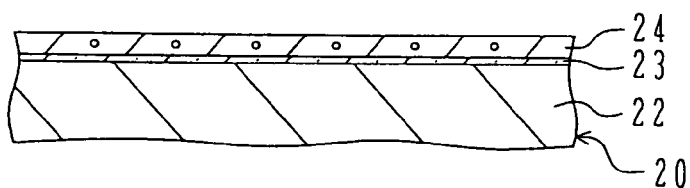

FIGS. 6Ax to 6Fy are cross sectional views illustrating manufacture processes for a non-SAS type flash memory such as shown in FIG. 5A and 5B. In the reference symbol of each drawing, A, B, C, . . . following a numerical number indicate the process order, and the next x and y indicate the cross sectional direction, x indicating the direction along the word line and y indicating the direction along the bit line.

As shown in FIGS. 6Ax and 6Ay, an element isolation region 21 of shallow trench isolation (STI) is formed in the silicon substrate 20, and ion implantation is executed to form wells such as a p-type well 22. A gate oxide film 23 is formed by thermally oxidizing the silicon substrate surface, and a floating gate polysilicon layer 24 is formed on the gate oxide film by CVD.

Figure 6B:
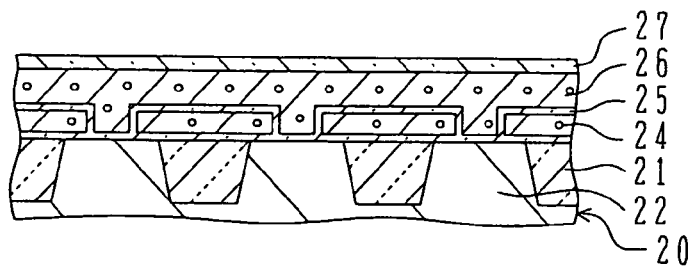
Figure 6B:
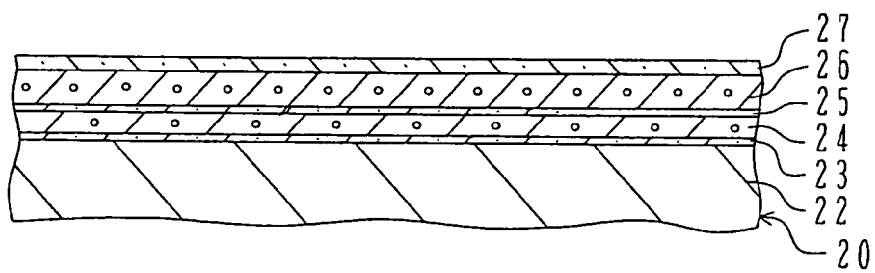

As shown in FIGS. 6Bx and 6By, the floating gate polysilicon layer 24 is patterned in stripe shapes by photolithography and etching. An oxide film, a nitride film and an oxide film are stacked to form an ONO film 25. A control gate polysilicon layer 26 and an antireflection silicon nitride film 27 are deposited by CVD, covering the striped polysilicon layers 24 covered with the ONO film 25. Both the polysilicon layers 24 and 26 are electrically insulated by the ONO film 25.

Figure 6C:
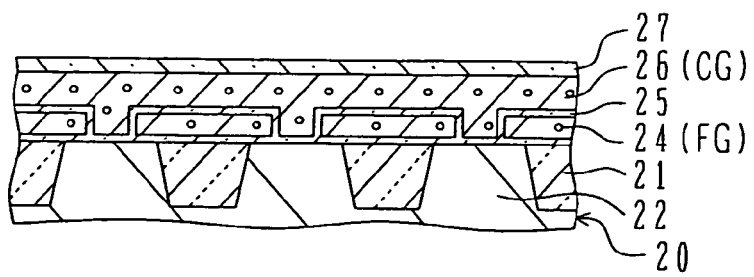
Figure 6C:
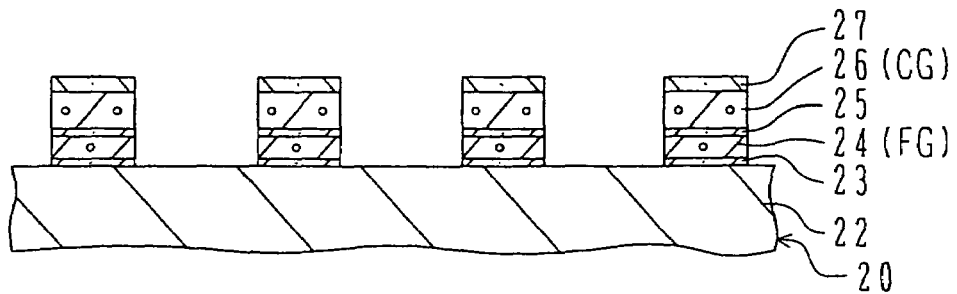

As shown in FIGS. 6Cx and 6Cy, a resist pattern having a word line shape is formed, and the silicon nitride film 27, polysilicon layer 26, ONO film 25 and polysilicon layer 24 are etched. After etching, thermal oxidation is performed to protect the surface of the polysilicon layer. A floating gate FG and a control gate CG serving also as the word line are therefore formed separately for each cell. This structure is called a gate electrode structure where appropriate.

Figure 6D:
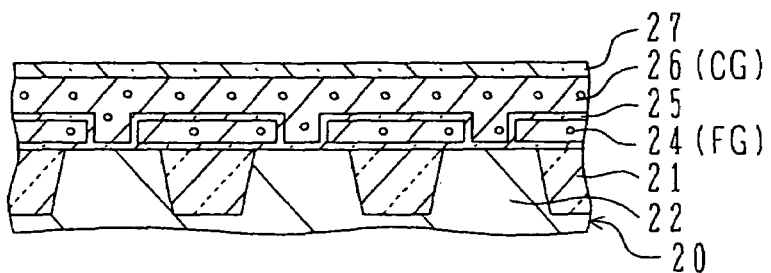
Figure 6D:
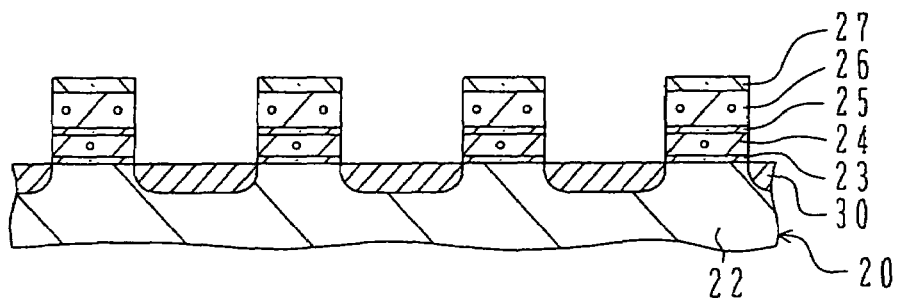

As shown in FIGS. 6Dx and 6Dy, n-type impurity ions are implanted into the well on both sides of the gate electrode structure to form n-type diffusion layers 30. The diffusion layers 30 constitute a source and a drain.

Figure 6E:
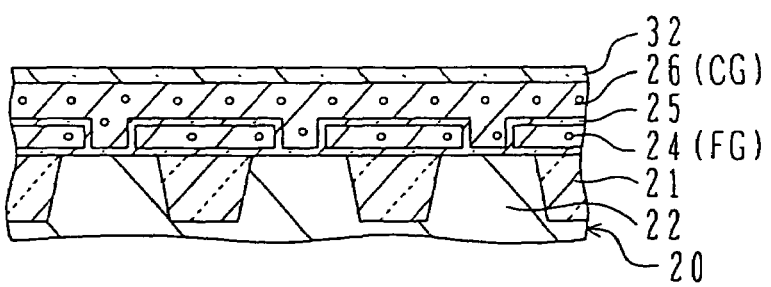
Figure 6E:
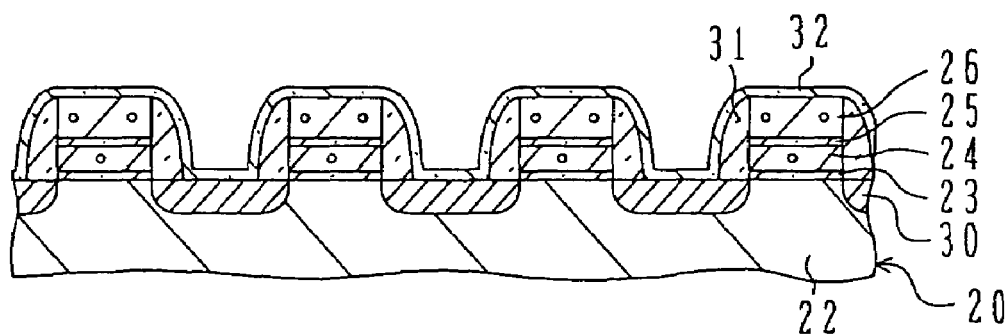

As shown in FIGS. 6Ex and 6Ey, an oxide film 31 is deposited by CVD, covering he gate electrode structure, and anisotropic etching such as RIE is performed to form side wall spacers on the side walls of the gate electrode structure. In some cases, n-type impurity ions are additionally implanted using side wall spacers and the gate electrode as a mask. After the side wall spacers 31 are formed, a silicon nitride film 32 is deposited on the substrate to form an etch stopper layer, covering the gate electrode structure.

Figure 6F:
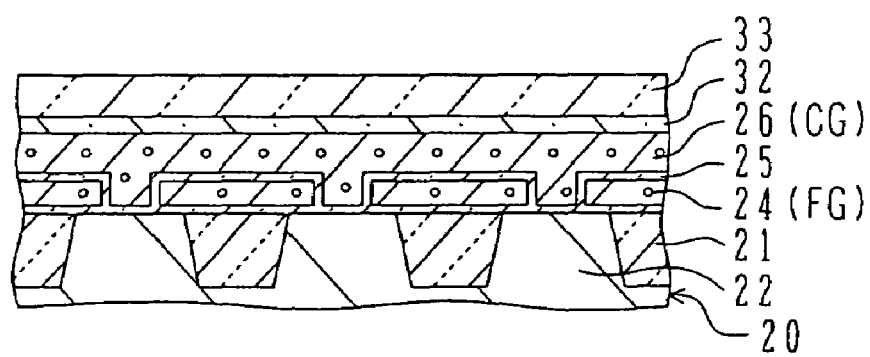
Figure 6F:
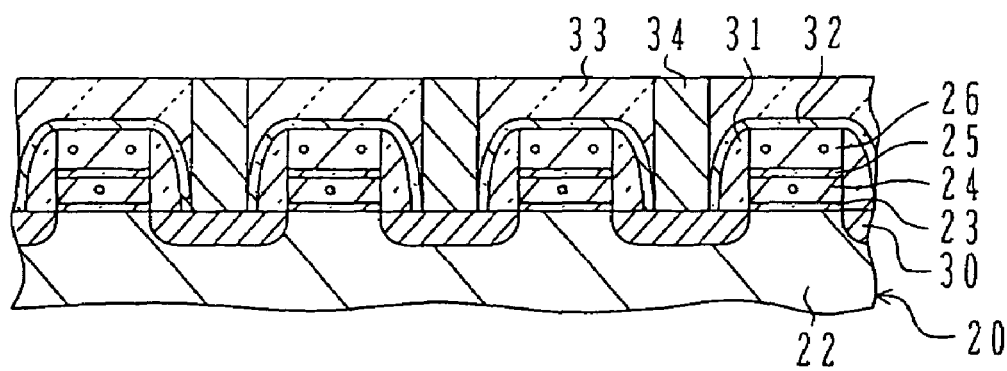

As shown in FIGS. 6Fx and 6Fy, a silicon oxide layer 33 is deposited on the substrate by CVD to form a lower interlayer insulating film and is planarized by CMP. By using photolithography and etching, contact holes reaching the diffusion layers 30 through the lower interlayer insulating film 33 are formed. During this etching, the etch stopper layer 32 stops once the oxide film etching, and thereafter the nitride film etching is performed to complete the contact holes. A barrier metal layer such as a Ti layer and a TiN layer is formed by sputtering or the like and a blanket W layer is formed thereon by CVD or the like. An unnecessary metal layer on the substrate surface is removed by CMP or the like to leave tungsten plugs 34 in the contact holes. Thereafter, the structure shown in FIGS. 5A and 5B is formed by executing processes such as interlayer insulating film forming, trench forming, copper wiring forming, copper diffusion preventive film forming, interlayer insulating film forming, trench/via hole forming, copper wiring forming, copper diffusion preventive film forming and the like. As the integrated circuit structure and its manufacture processes, in addition to the above-described structure and processes, various known structures and processes may be adopted.

FIGS. 7A to 7D are a plan view and cross sectional views of an SAS type flash memory.

Figure 7A:
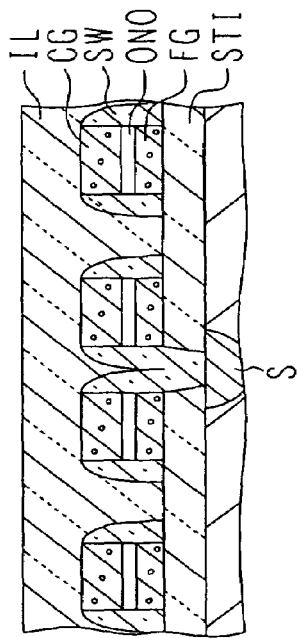
FIGS. 7A to 7D are a plan view and cross sectional views showing the structure of an SAS type flash memory.

As shown in the plan view of FIG. 7A, similar to the non-SAS type shown in FIG. 5A, flash memory cells FMC are disposed in a matrix shape. A different point from FIG. 5A is that there is no source contact and source line. As will be described in the following, the sources are continuously formed in the semiconductor substrate along the column direction. A bit line extends along the row direction similar to FIG. 5A and the minimum wiring spacing between adjacent bit lines is 0.125 µm.

Figure 7B:
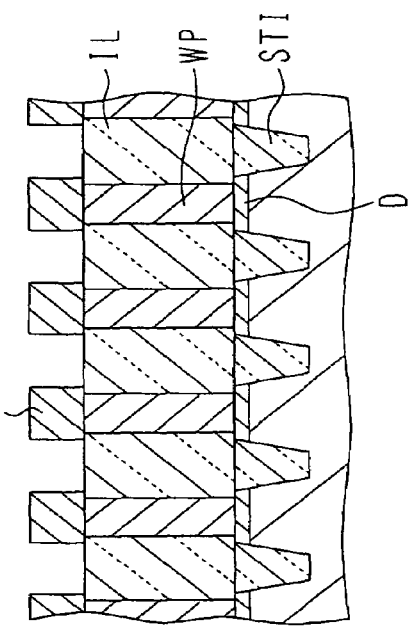
Figure 7C:
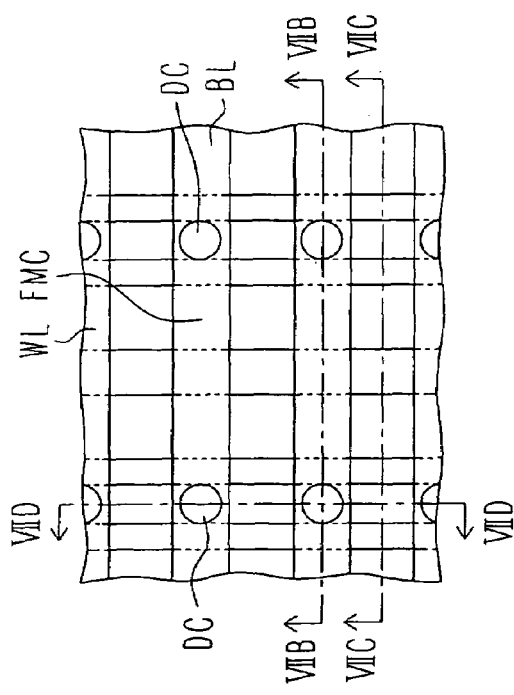
Figure 7D:
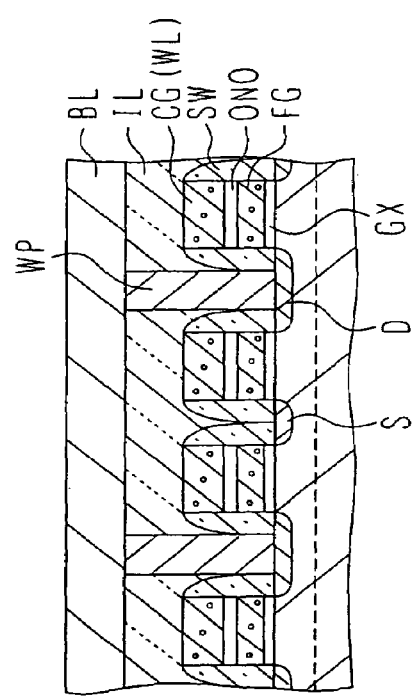

FIGS. 7B, 7C and 7D are cross sectional views taken along lines VIIB—VIIB, VIIC—VIIC and VIID—VIID shown in FIG. 7A. FIG. 7B corresponds to FIG. 5B. The gate electrode structure is similar to that shown in FIG. 5B excepting a pitch. The side wall spacers of the central two gate electrode structures contact and the tungsten plug WP does not exist therebetween. Therefore, the distance between the two word lines WL or drains D on both sides of the source S can be shortened. However, it is necessary to execute a process of forming continuous source regions in the substrate in place of the source lines.

FIG. 7C is a cross sectional view along the row direction on the element isolation region STI. The element separation region under the central coupled side walls SW is removed and an n-type source region S is formed in an exposed silicon substrate. This source region extends in the direction perpendicular to the drawing sheet.

FIG. 7D is a cross sectional view along the column direction and drains D. The element isolation region STI is formed in the silicon substrate, extending along the row direction, and each drain is formed between adjacent element isolation regions STI. An interlayer insulating film IL is formed on the substrate, and tungsten plugs WP are formed passing through the interlayer insulation film. This structure is the same as that of the non-SAS type. A first copper wring on the interlayer insulating film IL is a bit line BL. Since source wirings are not used, the wiring structure can be simplified.

FIG. 8 to FIG. 8Gy2 are cross sectional views illustrating the manufacture processes of the SAS type flash memory shown in FIG. 7A to 7D. The reference symbol of each drawing has the same meanings as those of FIG. 6. The last numeral value indicates a difference of positions when there are two cross sections in the same direction.

FIGS. 8A, 8Bx and 8By illustrate similar processes to those of FIGS. 6Ax, 6Bx and 6Cy. These processes form an STI 21, a well 22, a gate oxide film 23, a polysilicon layer 24, an insulating layer 25, a polysilicon layer 26 and a silicon nitride layer 27, forming a gate electrode structure.

FIGS. 8Cy1 and 8Cy2 show a source implantation process. A resist mask PR1 opens a stripe region along a source region 28, and boron ions are implanted after thermal oxidation to form pockets 29. FIG. 8Cy2 shows the STI region.

FIGS. 8Dy1 and 8Dy2 illustrate a process of implanting n-type impurity ions As into the stripe-shaped region along drains. FIG. 8Dy2 shows the region on STI. STI adjacent to the drain region is exposed in a stripe-shaped opening of a resist pattern PR3, and As ions are implanted to form n-type drain regions 30. STI shields the ion implantation.

FIGS. 8Ey1 and 8Ey2 illustrate an STI etching process. A stripe region along the source region is exposed by using a resist pattern PR3 and STI is etched by oxide film etching. After the substrate surface is exposed, the surface is thermally oxidized. Impurity ions of an n-type are injected to form n-type regions 28 and connect source regions.

FIGS. 8Fx, 8Fy1 and 8Fy2 illustrate a side wall spacer forming process and an etch stopper forming process. Side wall spacers 31 are formed by forming an oxide film by CVD and anisotropically etching it. In some cases, n-type impurity ions are additionally implanted using side wall spacers and the gate electrode as a mask. A nitride film is formed by CVD to deposit an etch stopper 32. As shown in FIG. 8Fy2, the side wall spacers 31 enter also the recess formed by removing STI.

FIGS. 8Gx, 8Gy1 and 8Gy2 illustrate a tungsten plug forming process after an interlayer insulating film is formed. An interlayer insulating film 33 of silicon oxide or the like is formed on the substrate, and contact holes are formed therethrough to bury a tungsten plug 34 in each contact hole. This process itself is similar to that for the non-SAS type.

Figure 9:
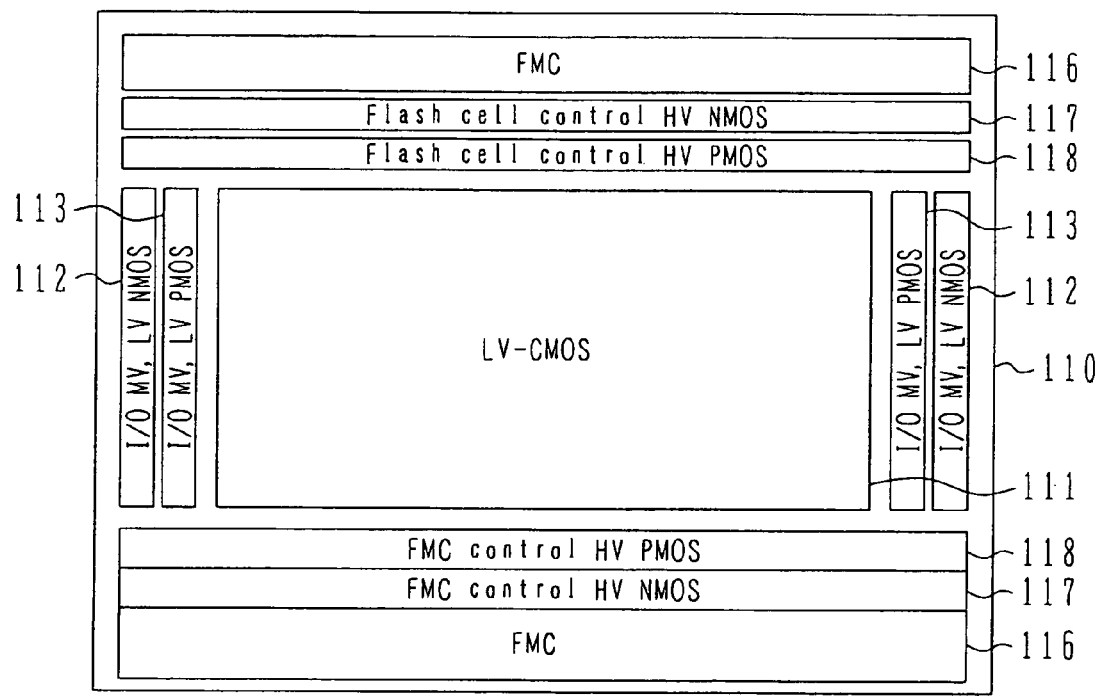
FIG. 9 is a plan view showing an example of the structure of a semiconductor integrated logic circuit device mixedly mounting flash memory cells.

FIG. 9 shows an example of the structure of a semiconductor logic integrated circuit device mixedly mounting flash memory cells. In a central area of a semiconductor chip 110, a logic CMOS circuit 111 is disposed which operates at a low voltage (LV, e.g., 1.2 V). Disposed on both sides of the logic CMOS circuit are an input/output n-channel MOS transistor (NMOS) circuit 112 operating at a low voltage (LV, e.g., 1.2 V) and an input/output p-channel MOS transistor (PMOS) circuit 113 operating at a middle voltage (MV, e.g., 3 V). A flash memory circuit 116 is disposed in upper and lower areas of the semiconductor chip 110. In an area on the inner side of the chip relative to the flash memory circuit, an NMOS circuit 117 and a PMOS circuit 118 are formed for controlling the flash memory cells. The NMOS circuit 117 and PMOS circuit 118 are made of high voltage (HV, e.g., 9 V) transistors.

Multilayer wirings are formed on a semiconductor chip. Although lower level wirings are formed dense, the copper wirings among others are formed by selecting the wiring pitch satisfying the above-described minimum wiring spacing. It is preferable to lower the dielectric constant of an interlayer insulating film in order to reduce parasitic capacitance between wirings. As a low dielectric constant insulating material, there are known inorganic insulating material such as F-doped silicon oxide and porous silicon oxide, and organic material such as SiLK (registered trademark).

Figure 10A:
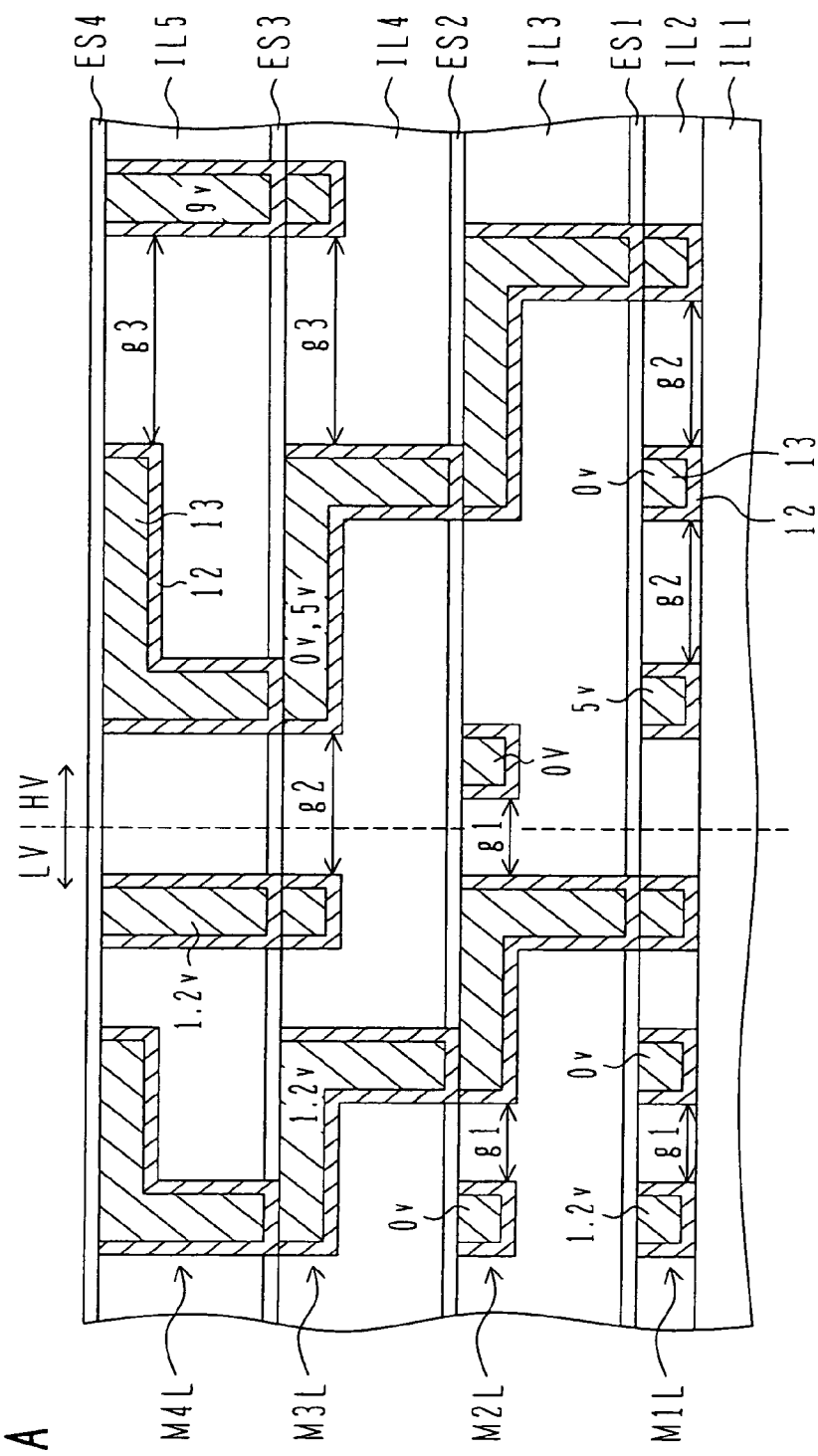
FIGS. 10A, 10B and 10C are cross sectional views showing an example of a multilayer wiring structure.
Figure 10C:
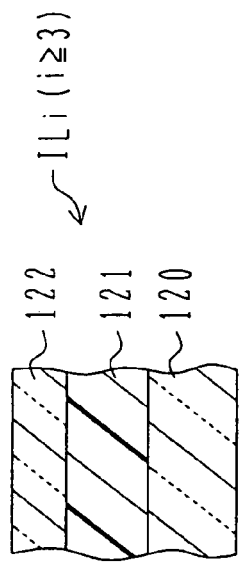
Figure 10B:
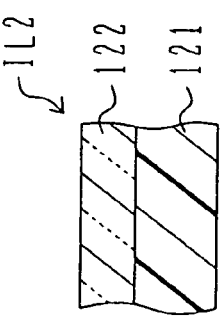

FIGS. 10A, 10B and 10C show an example of a multilayer wiring structure. Semiconductor devices are formed on a semiconductor substrate as shown in FIG. 5B, and the lower interlayer insulting layer IL1 is formed. Tungsten plugs are buried in the lower interlayer insulating layer.

As shown in FIG. 10A, a multi-layer wiring structure is formed on the lower interlayer insulating layer IL1. The multilayer structure has interlayer insulating films IL1, IL2, IL3, IL4 and IL5 stacked with etch stoppers ES1, ES2 and ES3 being interposed therebetween, and an etch stopper ES4 is formed on the upper surface. Copper wirings M1L, M2L, M3L and M4L are buried in the respective interlayer insulating layers. Each copper wiring is constituted of a lamination of a barrier metal layer 12 and a copper layer 13. For example, the lower interlayer insulating layer IL1 is made of silicon oxide such as PSG. Copper wirings are formed passing through the whole thickness of the upper interlayer insulating layer IL2. In order to reduce parasitic capacitance, it is desired to lower the effective dielectric constant of the whole interlayer insulating film IL2. It is desired that a portion of the interlayer insulating film IL2 contacting the etch stopper ES1 serving also as the copper diffusion preventive film is made of silicon oxide.

For example, as shown in FIG. 10B, the interlayer insulating film IL2 has a lamination structure of an organic low dielectric constant (low-k) material layer 121 having a thickness of 150 nm and a silicon oxide layer 122 having a thickness of 100 nm.

The copper wirings M2L, M3L and M4L of a dual damascene structure are buried in the interlayer insulating films IL3, IL4 and IL5 respectively. A via conductor has a small occupation area and less influences the parasitic capacitance of the whole wirings. Even if a portion of the interlayer insulating film surrounding the via conductor is made of a silicon oxide layer of a high reliability, the influence upon a dielectric constant is small.

FIG. 10C shows an example of the structure of the interlayer insulating films IL3, IL4 and IL5. For example, each film has the lamination structure of a silicon oxide layer 120 having a thickness of 280 nm, a low-k material layer 121 having a thickness of 150 nm and a silicon oxide layer 122 having a thickness of 100 nm. The spaces between wiring patterns buried in the trenches are occupied with the low-k material layer 121 and silicon oxide layer 122. Since the effective dielectric constant is lowered, the wiring parasitic capacitance can be reduced.

A low voltage (LV) logic circuit is formed in the left area in FIG. 10A and a high voltage (HV) flash memory circuit and its drive circuit are formed in the right area. A voltage indicated in FIG. 10A is assumed to be applied to each wiring. A wiring pitch g1 of wirings having a voltage difference of 1.2 V or smaller is set to 0.03 μm or longer. A wiring pitch g2 of wirings having a voltage difference over 1.2 V and to 5 V is set to 0.125 μm or longer. A wiring pitch g3 of wirings having a voltage difference over 5 V and to 10 V is set to 0.25 μm or longer. These criteria may not be applied to copper wirings in different layers or to polysilicon electrodes and tungsten plugs.

Since the above-described definite criteria are used, the wiring layout is easy and the chip area can be reduced.

The present invention has been described in connection with the preferred embodiments. The invention is not limited only to the above embodiments. It will be apparent to those skilled in the art that other various modifications, improvements, combinations, and the like can be made.

FIG. 2
FAILURE RATE (%)
DEPENDENCY OF FAILURE RATE UPON ELECTRIC FIELD DUE TO Cu MIGRATION
ELECTRIC FIELD INTENSITY (MV/cm)
MAXIMUM ALLOWABLE ELECTRIC FIELD (MV/cm)
TEMPERATURE (° C.)
FIG. 3C
TABLE 1: EXAMPLES OF OPERATION VOLTAGE OF LOGIC DEVICE
MIXEDLY MOUNTING FLASH MEMORY
SOURCE VOLTAGE
GATE (WORD LINE) VOLTAGE
DRAIN (BIT LINE) VOLTAGE
SUBSTRATE (WELL) VOLTAGE
LOGIC CIRCUIT
FLASH CELL
WRITE
ERASE
READ
FLOATING

FIG. 4A
TABLE 2: CRITERIA OF MINIMUM WIRING SPACING AT MAIN OPERATION VOLTAGES (TABLE 1)
|VOLTAGE BETWEEN ADJACENT WIRINGS|
MINIMUM WIRING SPACING (μm)
ELECTRIC FIELD BETWEEN WIRINGS (MV/cm)
FIG. 4B
TABLE 3: COMPARISON BETWEEN MINIMUM FLASH CELL SIZES
WHEN MINIMUM WIRING SPACING IS USED

What is claimed is:

1. A semiconductor device comprising:
a semiconductor substrate;
a plurality of circuit regions formed on said semiconductor substrate, said circuit regions including circuits driven at a multiple-voltage;
interlayer insulating film or films formed above said semiconductor substrate;
copper wirings buried in said interlayer insulating film or films, a minimum wiring spacing between adjacent wirings is so set that an electric field between adjacent wirings due to an applied voltage difference is at most 0.4 MV/cm; and
a copper diffusion preventive film formed on each said interlayer insulating film, covering an upper surface of said copper wirings;
wherein said plurality of circuit regions include a flash memory cell array and a drive circuit for the array.

2. The semiconductor device according to claim 1, wherein said plurality of circuit regions include a logic circuit to be driven at a lower voltage than a drive voltage for a flash memory cell.

3. The semiconductor device according to claim 1, wherein said copper wirings are damascene wirings made of a lamination layer of a barrier metal layer and a copper layer, and said copper diffusion preventive film is a silicon nitride film.

4. The semiconductor device according to claim 1, wherein said copper wirings are damascene wirings made of a lamination layer of a barrier metal layer and a copper layer, and said copper diffusion preventive film is an SiC film.

5. The semiconductor device according to claim 1, wherein said interlayer insulating film further includes a layer having a low dielectric constant lower than a dielectric constant of silicon oxide.

* * * * *